(12) United States Patent
Cueff et al.

(10) Patent No.: US 8,004,154 B2
(45) Date of Patent: Aug. 23, 2011

(54) PIEZOELECTRIC ACTUATION STRUCTURE INCLUDING AN INTEGRATED PIEZORESISTIVE STRAIN GAUGE AND ITS PRODUCTION METHOD

(75) Inventors: Matthieu Cueff, Grenoble (FR); Emmanuel Defay, Voreppe (FR); François Perruchot, Grenoble (FR); Patrice Rey, St. Jean de Moirans (FR)

(73) Assignee: Commissariat a l'Energie Atomique et aux Energies Alternatives (FR)

( * ) Notice: Subject to any disclaimer, the term of this patent is extended or adjusted under 35 U.S.C. 154(b) by 0 days.

(21) Appl. No.: 12/898,292

(22) Filed: Oct. 5, 2010

(65) Prior Publication Data

US 2011/0080069 A1    Apr. 7, 2011

(30) Foreign Application Priority Data

Oct. 6, 2009   (FR) ...................... 09 04774

(51) Int. Cl.
*H01L 41/08* (2006.01)
(52) U.S. Cl. ......... 310/328; 310/324; 310/338; 310/365
(58) Field of Classification Search .................. 310/324, 310/328, 338, 365
See application file for complete search history.

(56) References Cited

U.S. PATENT DOCUMENTS

| | | | | |
|---|---|---|---|---|
| 5,717,132 | A * | 2/1998 | Watanabe et al. | 73/105 |
| 6,075,585 | A * | 6/2000 | Minne et al. | 355/71 |
| 7,129,472 | B1 * | 10/2006 | Okawa et al. | 250/234 |
| 2005/0009197 | A1 | 1/2005 | Adams et al. | |
| 2005/0051515 | A1 | 3/2005 | Nam | |
| 2005/0150280 | A1 | 7/2005 | Tang et al. | |
| 2008/0011058 | A1 * | 1/2008 | Lal et al. | 73/54.23 |
| 2009/0007645 | A1 * | 1/2009 | Shih et al. | 73/105 |
| 2009/0038404 | A1 | 2/2009 | Tang et al. | |
| 2010/0031752 | A1 | 2/2010 | Delapierre et al. | |
| 2010/0154088 | A1 * | 6/2010 | Sandhu | 850/46 |

FOREIGN PATENT DOCUMENTS

GB    2365206    2/2002

OTHER PUBLICATIONS

Kobayashi et al., "A Fatigue Test Method for Pb(Zr,Ti)O3 Thin Films by Using MEMS-Based Self-Sensitive Piezoelectric Microcantilevers," Nat'l Inst of Adv. Indust. Sci & Tech., J. of Micromechanics and Microengineering, vol. 18, pp. 115007-115012 (2008).
Lu et al., "High-Q and CMOS Compatible Single Crystal Silicon Cantilever with Separated On-Chip Piezoelectric Actuator for Ultra-Sensitive Mass Detection," Nat'l Inst of Adv. Indust. Sci & Tech, MEMS 2008 (Jan. 2008).

\* cited by examiner

*Primary Examiner* — Thomas M Dougherty
(74) *Attorney, Agent, or Firm* — Baker & Hostetler

(57) ABSTRACT

The invention relates to a piezoelectric actuation structure including at least one strain gauge and at least one actuator produced from a stack on the surface of a substrate of at least one layer of piezoelectric material arranged between a bottom electrode layer and a top electrode layer, at least a portion of the stack forming the actuator being arranged above a cavity produced in the substrate, characterized in that the strain gauge is a piezoresistive gauge located in the top electrode layer and/or the bottom electrode layer, the layer or layers including electrode discontinuities making it possible to produce said piezoresistive gauge. The invention also relates to a method for producing such a structure.

17 Claims, 9 Drawing Sheets

PIEZOELECTRIC ACTUATION STRUCTURE INCLUDING AN INTEGRATED PIEZORESISTIVE STRAIN GAUGE AND ITS PRODUCTION METHOD

CROSS-REFERENCE TO RELATED APPLICATION

This application claims priority to foreign French patent application No. FR 09 04774, filed on Oct. 6, 2009, the disclosure of which is incorporated by reference in its entirety.

FIELD OF THE INVENTION

The field of the invention is that of membrane-type piezoelectric actuators, with fixed-free beam or fixed-fixed beam, which make it possible to produce highly integrated devices.

BACKGROUND OF THE INVENTION

Generally, in these devices, the piezoelectric effect involved is reversible and a deflection can be measured by a piezoelectric gauge. Such a gauge can be produced on a piezoelectric actuator by photolithography. One portion of the top electrode serves as a sensor and the other as an actuator. This is what has been produced by T. Kobayashi et al. "A fatigue test method for Pb(Zr,Ti)O$_3$ thin films by using MEMS-based self-sensitive piezoelectric microcantilevers", Kobayashi T., Maeda R., Itoh T., National Institute of Advanced Industrial Science and Technology, Journal of Micromechanics and Microengineering, 18 (2008), 115007, 6 pages, and which is illustrated in FIG. 1 which shows a piezoelectric gauge 11 associated with a piezoelectric actuator 10.

The density of charges generated by the piezoelectric material is proportional to the strain applied to the material. The greatest strains are located at the fixed end. Furthermore, the total quantity of charges recovered is also proportional to the surface area of the electrode. To recover the maximum of charges at a fixed level of strains, it is therefore essential to be situated at the fixed end and have the greatest possible electrode surface area. However, if the surface area dedicated to measuring the deflection is increased, the surface area used for actuation is reduced accordingly. Furthermore, if the maximum deflection is required, piezoelectric actuation at the fixed end must be favoured.

In this configuration, the deflection measurement and the actuation compete strongly. In order to produce devices in which the actuation and the deflection measurement are both fully integrated, it is necessary to use another type of gauge for the deflection measurement.

To this end, it is also known to use integrated piezoresistive gauges, the deflection measurement by such strain gauges being notably highly advantageous in micro- and nano-electromechanical systems (MEMS and NEMS), because the latter can be fully integrated and are therefore easy to produce. These gauges are used in all kinds of sensors (chemical, biological, inertial, etc.) and can be of reduced dimensions since the signal is no longer proportional to the surface area of the gauge, but to its length.

The expression "piezoresistive gauge" should be understood to mean a gauge whose electrical resistance is modified by the action of a mechanical strain due to a deformation.

Most of the applications use piezoresistive gauges based on p-doped silicon. The gauges are directly produced on the silicon substrate. This material makes it possible to have very high gauge factors (typically greater than 20). However, they are highly sensitive to temperature variations, which increases thermal noise. Their resistance is also very high, which limits the current that can be passed through these gauges. Furthermore, producing these gauges involves complicated and expensive fabrication techniques (ionic and/or epitaxial implantation). It is this type of gauge that was used by J. Lu et al., "High-Q and CMOS compatible single crystal silicon cantilever with separated on-chip piezoelectric actuator for ultra-sensitive mass detection", Lu J., Ikehara T., Zhang Y., Mihara T., Itoh T., Maeda R., National Institute of Advanced Industrial Science and Technology, MEMS 2008, Jan. 13-17 2008, Tucson, Ariz., USA, and presented in FIG. 2. More specifically, according to this type of device that uses a piezoresistive gauge, an actuator comprises a piezoelectric material 22 contained between a bottom electrode 23 and a top electrode 24, the silicon substrate being in a region 25 that is locally doped, for example, by boron ions, all of the contact points 26 typically being able to be provided by an Au/Cr bilayer, the actuator being protected by a layer 27 of SiO$_2$ type.

Metal strain gauges have also already been proposed for certain applications. The gauge factor is then weaker than for the silicon gauges (typically of the order of 2), but the resistance of the gauge is lower, which makes it possible to increase the current density. The same signal level is thus obtained as with silicon gauges. The measurement noise obtained is also limited, which makes it possible to obtain a sensitivity equivalent to that of piezoresistive gauges. Such is notably the subject of US patent 2009/003804 by H. Tang et al.: "Metallic thin film piezoresistive transduction in micromechanical and nanomechanical devices and its application in self-sensing SPM probes", Tang H., Li M., Roukes M. L., California Institute of Technology, US 2009/0038404 A1, an exemplary application of which is the atomic force microscope presented in FIG. 3.

FIG. 3 is the diagram of an atomic force microscope tip using a piezoelectric actuation 5 and a measurement of deflection of the tip 1 by a metal strain gauge 9.

The production of these gauges however entails costly microelectronic production steps that are not without influence on the device.

It is therefore best to find a way of measuring the deflection of a piezoelectric actuator to produce an all-integrated device without in any way making its production more difficult.

In practice, in summary, the solutions of the prior art propose piezoelectric actuator stacks of the following type: elastic layer/bottom electrode/piezoelectric material/top electrode, as illustrated in FIG. 1, and to integrate the deflection measurement, either to separate the piezoelectric stack into a region used for actuation and a region used for measurement, or to use a piezoresistive gauge that may be made of silicon.

In the case of a piezoelectric gauge like that illustrated in FIG. 1, it is best to make a trade-off between the surface area dedicated to measurement and the surface area dedicated to actuation.

Moreover, the piezoresistive gauges and the metal strain gauges are produced by specific and costly technological steps, and increase the stack complexity. In practice, the known piezoelectric actuators that include a metal strain gauge are produced by a stack of layers independently producing the actuator and the strain gauge. The latter is, for example, produced by a metal layer arranged under the elastic layer of the stack producing the piezoelectric actuator.

SUMMARY OF THE INVENTION

In this context, and in order to obtain devices that are as integrated as possible, the present invention provides a solution in which the piezoresistive strain gauges are produced by a shrewd and simple technology.

More specifically, the subject of the present invention is a piezoelectric actuation structure including at least one strain gauge and at least one actuator produced from a stack on the surface of a substrate of at least one layer of piezoelectric material arranged between a bottom electrode layer and a top electrode layer, at least a portion of the stack forming the actuator being arranged above a cavity produced in the substrate, characterized in that the strain gauge is a piezoresistive gauge located in the top electrode layer and/or the bottom electrode layer, said layer or layers including electrode discontinuities making it possible to produce said piezoresistive gauge.

According to a variant of the invention, the piezoresistive gauge is produced in at least a portion of the top electrode layer and/or the bottom electrode layer located above the cavity.

According to a variant of the invention, said piezoresistive gauge is produced on at least a portion of the surround of the top and/or bottom electrode.

Such a variant is advantageous for practical contact reestablishment reasons. However, it may also be advantageous in other embodiments to produce a gauge notably at the centre of the actuator.

Moreover, the substrate may include a layer or a set of layers and the cavity may be produced in all or part of at least one of the layers of the substrate (for example, by etching a sacrificial layer of the substrate).

According to a variant of the invention, the actuation structure also includes an elastic substrate layer above said cavity, on which the bottom electrode is located.

According to a variant of the invention, the actuation structure includes a so-called fixed-free structure including a free overhang on three sides.

According to a variant of the invention, the actuation structure includes a fixed structure over all or part of its periphery. According to a variant of the invention, the actuation structure also includes at least one piezoelectric gauge, the piezoresistive gauge and the piezoelectric gauge including a common layer chosen from the top electrode layer and the bottom electrode layer.

According to a variant of the invention, the piezoresistive strain gauge includes at least two contact blocks connected to the piezoresistive gauge located in at least one of the electrode layers and at least two contact blocks of the piezoelectric actuator located in at least one of the electrode layers.

According to a variant of the invention, the piezoresistive gauge is produced in the bottom and top electrode layers.

According to a variant of the invention, the actuation structure includes a set of resistive lines making it possible to integrate the piezoresistive gauge in a Wheatstone bridge structure.

According to a variant of the invention, the piezoelectric material is of lead zirconate and titanium or PZT type, or of aluminium nitride type or of zinc oxide (ZnO) type.

The bottom and/or top electrode layers may advantageously be made of a platinum (Pt) or tungsten (W) or aluminium (Al) or ruthenium (Ru) or ruthenium oxide ($RuO_2$) or iridium (Ir), iridium oxide ($IrO_2$), copper (Cu), silver (Ag), nickel (Ni) or chrome (Cr) type material or of alloys of this type of metals.

The elastic substrate layer may advantageously be made of a silicon (Si) type or silicon oxide ($SiO_2$) type, or silicon nitride ($Si_xN_y$) type material or of conductive polymers.

Another subject of the invention is a method for fabricating a piezoelectric actuation structure according to the invention and comprising the following steps on a substrate:
deposition of a bottom electrode layer;
deposition of a layer of piezoelectric material;
deposition of a top electrode layer;
etching of at least one electrode layer through a mask so as to define at least one piezoresistive strain gauge and at least one actuator.

According to a variant, the method also includes the deposition of an elastic layer on a substrate, on which the bottom electrode layer is deposited.

According to a variant, the method also includes:
the etching of the elastic layer/bottom electrode layer/piezoelectric material layer stack defining a mesa;
the deposition of the top electrode layer on the mesa and the substrate.

According to a variant, the method includes the etching of the top electrode so as to define a piezoresistive gauge from the top electrode layer.

According to a variant, the method includes:
etching of the layer of piezoelectric material on the bottom electrode layer so as to define a mesa of piezoelectric material of smaller dimensions;
deposition of the top electrode layer on the layer of piezoelectric material and on the bottom electrode layer;
etching of both the top electrode and bottom electrode layers so as to define the piezoresistive gauge in the stack of the two electrode layers.

BRIEF DESCRIPTION OF THE DRAWINGS

The invention will be better understood and other advantages will become apparent from reading the following description, given as a nonlimiting example, and by virtue of the appended figures in which.

DETAILED DESCRIPTION

The invention thus provides a piezoelectric actuation structure including a stack of at least one piezoelectric layer arranged between a bottom electrode and a top electrode, this stack being arranged on a substrate layer and at least one piezoresistive strain gauge produced in the same layer as the top and/or bottom electrode. The piezoresistive gauge is produced by photolithography of one or of both electrodes.

Thus, the integration of a metal strain gauge, without adding additional technological steps, on a structure using a piezoelectric actuation makes it possible to produce a device in which the actuation and the deflection measurement are fully integrated at no extra cost and with no additional technological step. By using a strain gauge instead of a piezoelectric gauge, the surface area associated with the actuation is maximized without degrading the area used to measure the deflection.

Advantageously, and according to a variant of the invention, the actuation structure is produced on the surface of a so-called elastic layer, also allowing for a deformation in a direction perpendicular to the plane of the structure (off-plane). However, the invention may also be applied in the case of a piezoelectric layer inserted between two electrode layer levels, without the presence of any elastic layer.

Generally, the method for producing the gauge notably comprises the following steps:

1) the deposition of the elastic layer and of the bottom electrode;
2) the deposition of the piezoelectric material;
3) the etching of the piezoelectric material;
4) the deposition of the top electrode;
5) the etching of one or both electrode layers to produce the gauge.

Thus, the production of the gauge is included in the step 5. Its implementation requires no additional step, only the addition of the resistive line to the mask. The best way of maximizing the surface area dedicated to the piezoelectric actuation is to produce the piezoresistive line constituting the gauge on the surround of the structure.

This structure may be of fixed-free type and it may concern a free overhang on three sides.

This structure may also be of the fixed-fixed type, and may thus be a beam or membrane that is free on two sides.

According to a first variant of the invention illustrated in FIGS. 4*a* to 4*d*, the piezoresistive gauge is produced within the top electrode.

More specifically, on the surface of a substrate that is not represented, the following layers are stacked:
an elastic layer 45;
a bottom electrode layer 43;
a layer of piezoelectric material 42.

Figure 1:
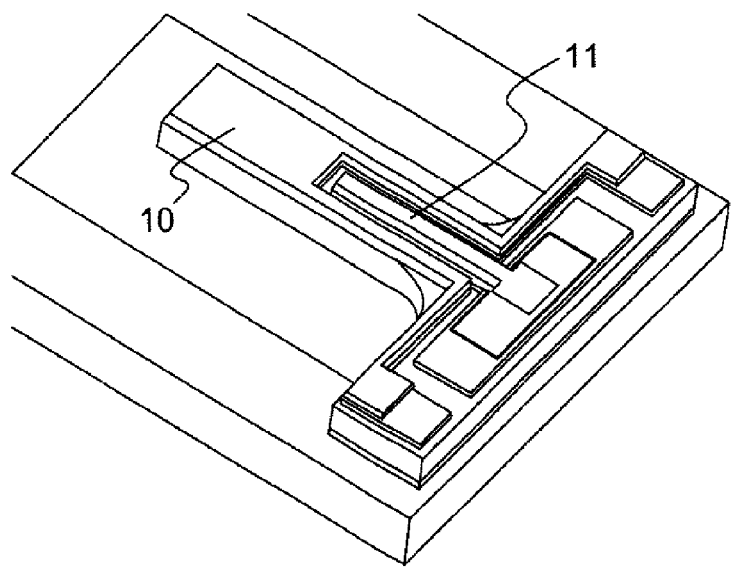
FIG. 1 illustrates a first exemplary piezoelectric actuation structure including a piezoelectric strain gauge according to the prior art.
Figure 2:
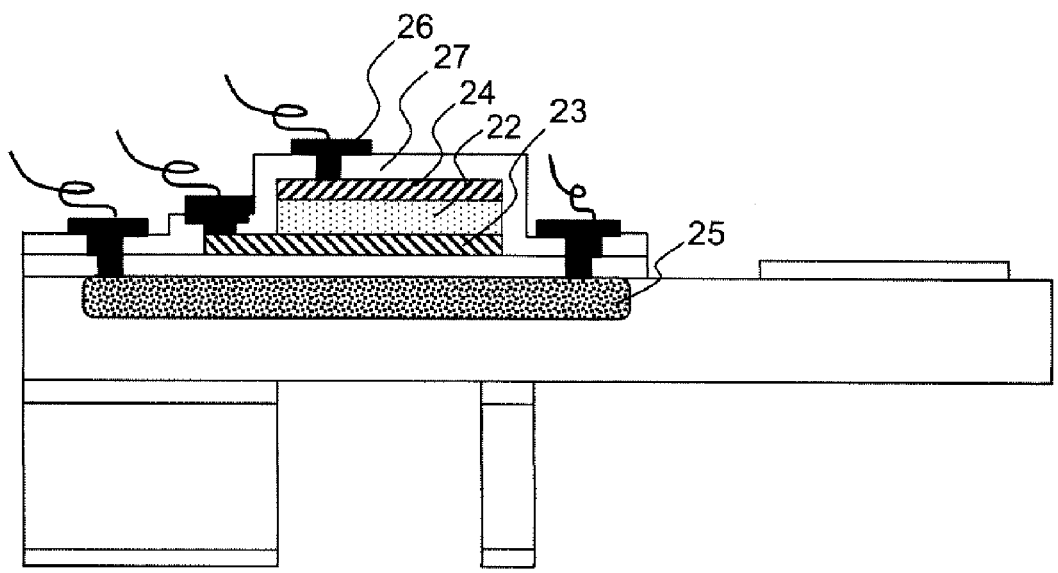
FIG. 2 illustrates a second exemplary piezoelectric actuation structure including a piezoresistive strain gauge according to the prior art.
Figure 3:
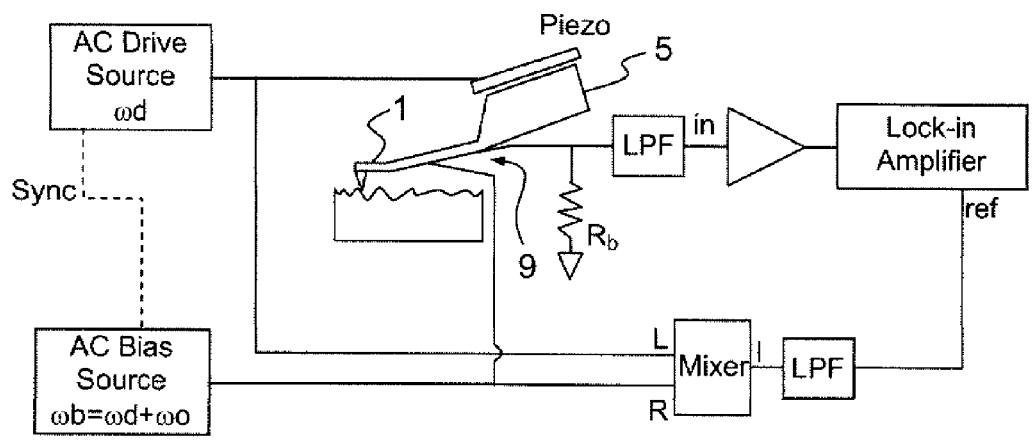
FIG. 3 illustrates a third exemplary piezoelectric actuation structure including a piezoresistive strain gauge according to the prior art.
Figure 4A:
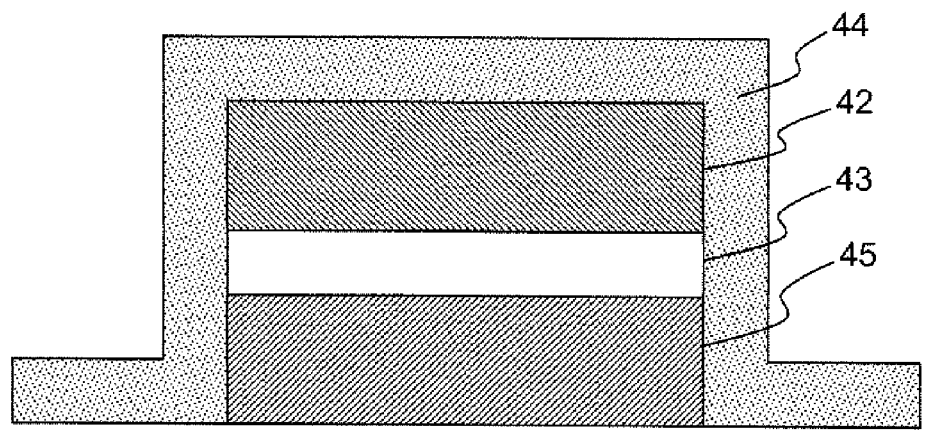
FIGS. 4a to 4d illustrate a variant embodiment of the invention in which the piezoresistive gauge is produced within the top electrode layer.

The whole is etched so as to define a mesa, on which is deposited a top electrode layer 44, as illustrated in FIG. 4*a*.

Figure 4B:
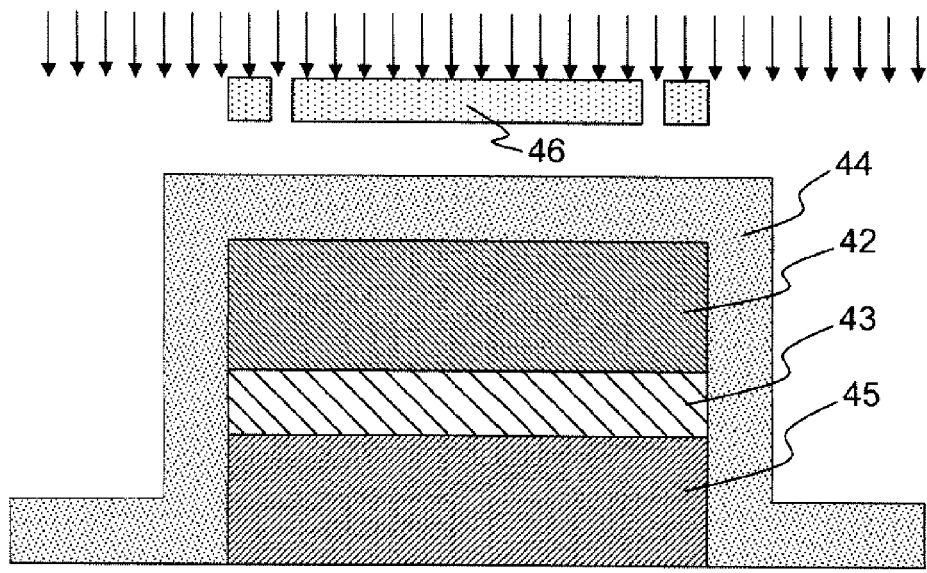

Using a photolithography mask, a photolithography operation is carried out as illustrated in FIG. 4*b*. For simplicity, this figure does not illustrate the layer of resin that is deposited on the layer 44 then insulated through the mask 46, then developed to enable said layer 44 to be etched, this resin being eliminated after etching.

Figure 4C:
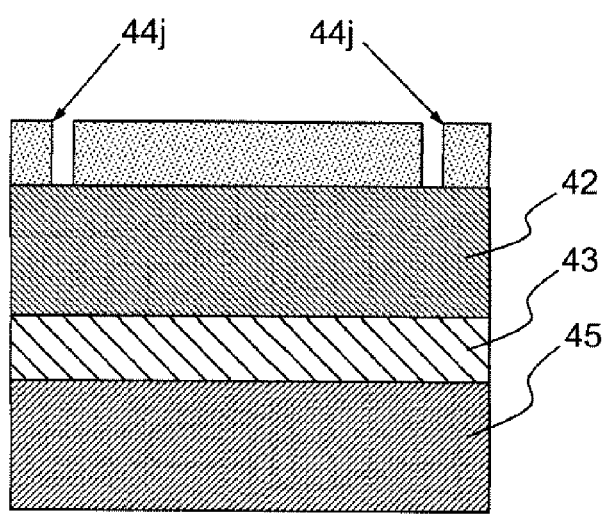

As illustrated in FIG. 4*c*, cut-outs are obtained within the top electrode layer so as to create discontinuities and thus define the elements 44*j* constituting the piezoresistive gauge.

Figure 4D:
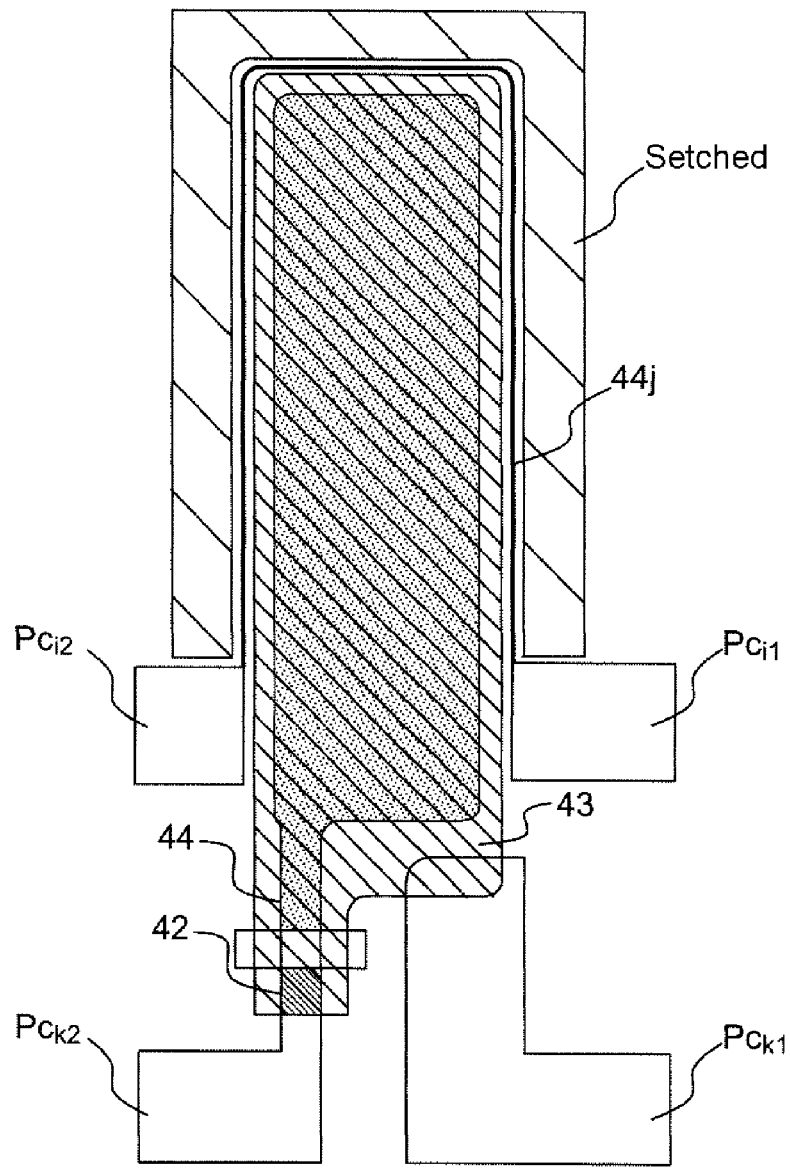

FIG. 4*d* illustrates a plan view of such a structure, showing the various elements: actuator and piezoresistive gauge. The piezoresistive gauge portion 44*j* is connected to contact blocks Pci1 and Pci2; the actuator portion is connected to contact blocks Pck1 and Pck2.

More specifically, the block Pck1 connects the bottom electrode, the block Pck2 connecting the top electrode. The cross-hatched portion relates to the layer of piezoelectric material 43, the bottom electrode layer being locally cut to enable contact to be re-established with the top electrode. Around the piezoresistive gauge there is represented a cross-hatched portion Setched, corresponding to the etched substrate region used to produce the actuator of fixed/free beam type. In practical terms, the electrode layer may be deposited on an intermediate layer on the substrate to be etched. Openings are produced in this layer that also make it possible to produce a subsequent etching mask for the substrate.

Figure 5:
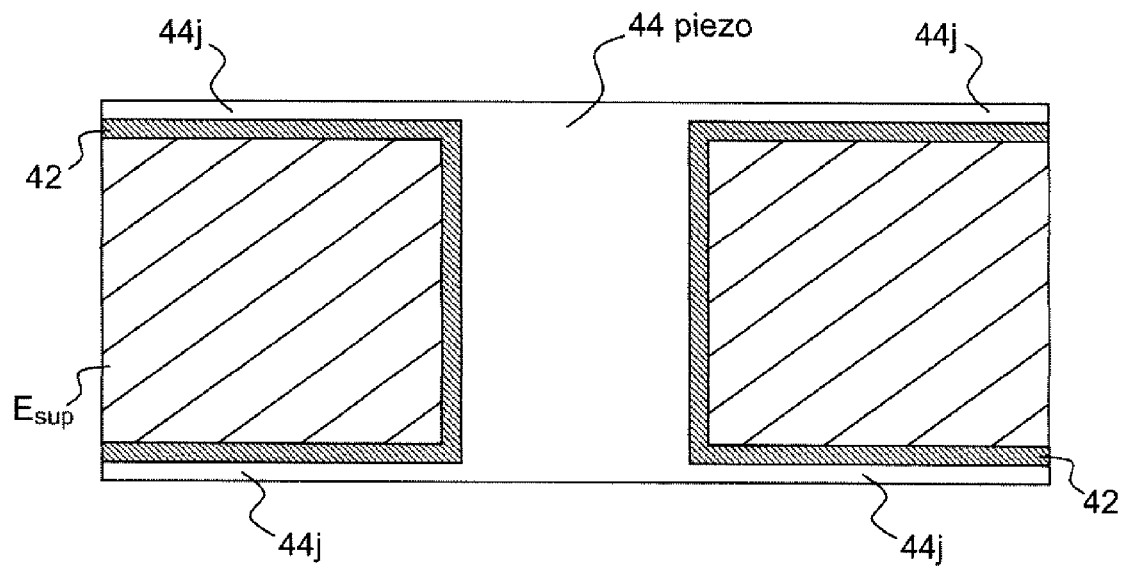
FIG. 5 illustrates a variant of the invention also integrating a piezoelectric gauge.

FIG. 5 illustrates a plan view of a variant of the invention in which piezoresistive gauges are also produced within the top electrode layer, said actuation structure also including a piezoelectric gauge in the central part. As represented in FIG. 5, the actuation structure has two metal gauges 44*j* and a central piezoelectric gauge 44$_{piezo}$, the actuation electrodes of the piezoelectric material E$_{sup}$ and the etched metal area corresponding to the surface of the piezoelectric material 42. The piezoelectric gauge and the metal gauges are made in the same electrode. One type of gauge or the other is used depending on the wiring of the electrical contact points, commonly called "pads". The benefit of combining both types of gauges is to be able to choose one or other of the detection methods depending on the situation. In dynamic operation, it is possible to choose the piezoelectric gauge because the measurement from the strain gauge will be limited by the noise. If a static strain is applied, the charges generated by the piezoelectric material will be dispelled gradually. However, the resistance of the strain gauge will not evolve over time. In static mode, it is therefore best to use the strain gauge.

Figure 6A:
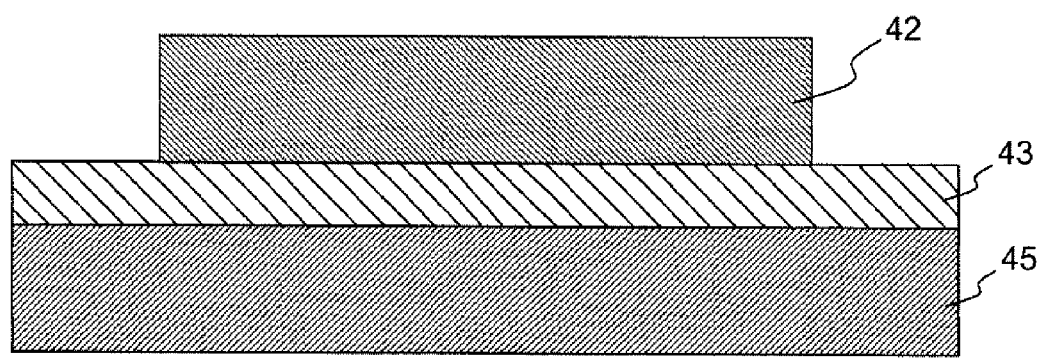
FIGS. 6a to 6d illustrate a variant of the invention in which the piezoresistive gauge is produced by virtue of both bottom and top electrode layers.
Figure 6B:
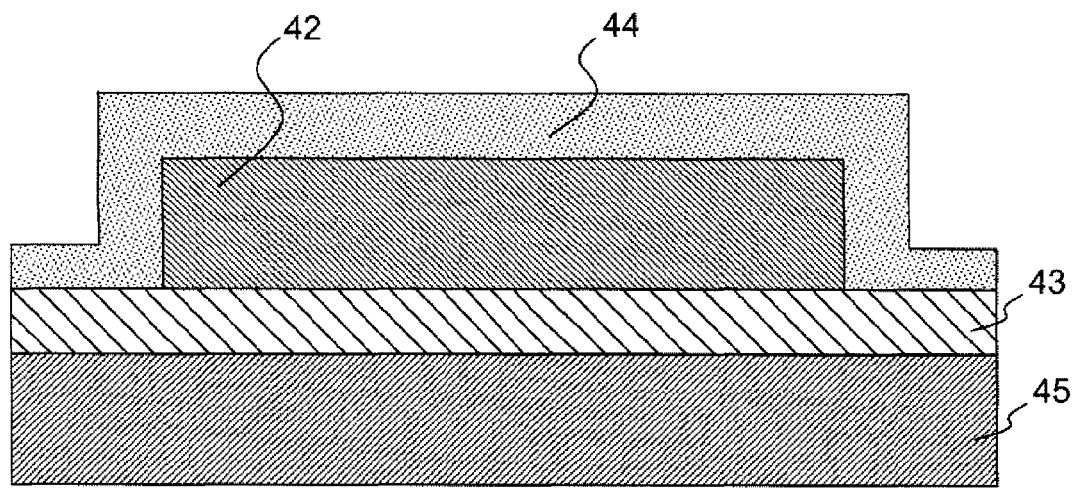
Figure 6C:
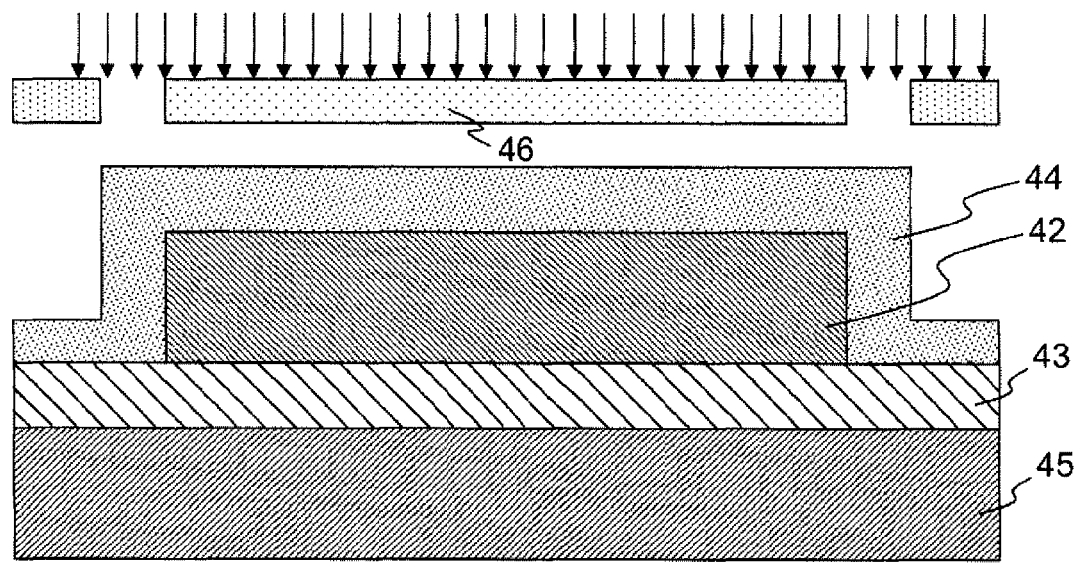
Figure 6D:
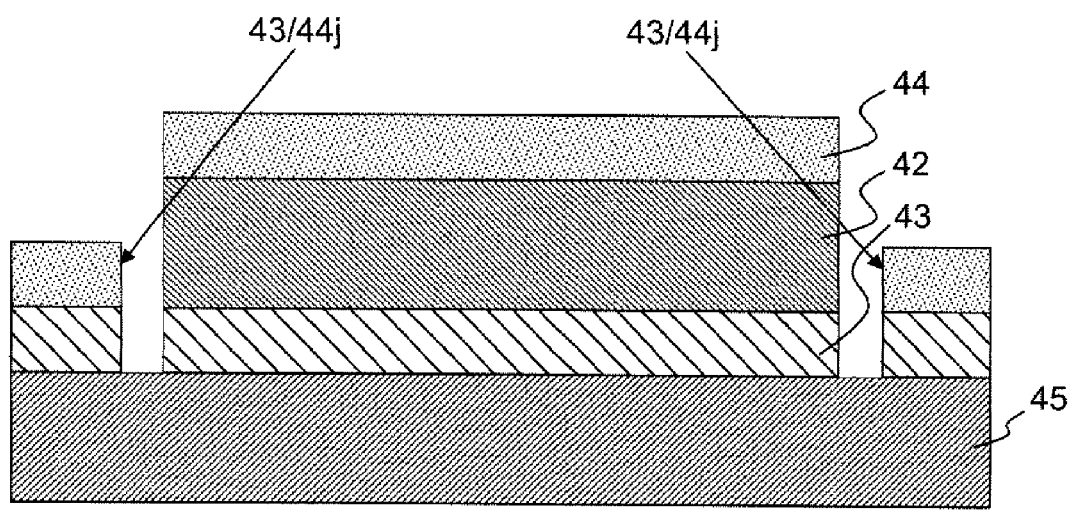

According to another variant of the invention, it is proposed to produce the metal strain gauge by using the two electrode layers 43 and 44. In this way, the thickness of the resistive line is increased, which reduces its resistance. Before depositing the top electrode layer 44, the piezoelectric material 42 is etched as represented in FIG. 6*a* so as to bring the two electrodes into contact on the surface of the structure, as represented in FIG. 6*b*. In the same way as when the gauge is produced on the top electrode only according to the first variant, a resistive line is left along the structure through a photolithography mask 46 as shown in FIG. 6*c* (according to the same steps, not represented, that are described for FIG. 4*b*). The structure obtained is illustrated in FIG. 6*d* and highlights the piezoresistive gauge elements 43/44*j*.

According to another variant of the invention, the piezoelectric actuation structure may comprise a piezoresistive gauge integrated in a Wheatstone bridge assembly structure. Such a configuration makes it possible to increase the resolution of the strain gauge.

Figure 7:
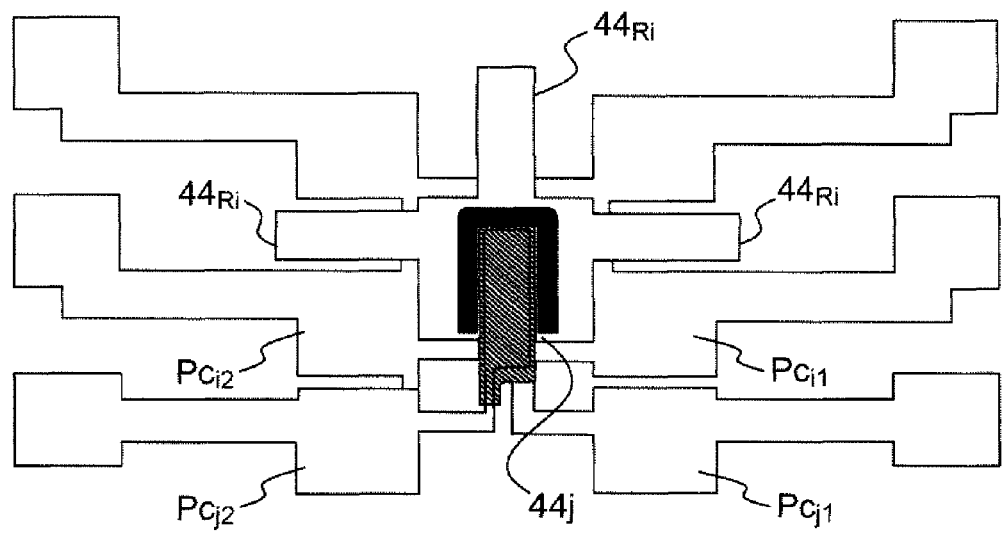
FIG. 7 illustrates a variant in which the piezoresistive gauge is integrated in a Wheatstone bridge structure.

Other resistors of the bridge may be produced in the same way by photolithography, by leaving resistive lines 44$_{Ri}$, on the substrate, in regions that are not free, unlike that constituting the piezoresistive gauge 44*j*. FIG. 7 thus illustrates such a piezoelectric actuation structure.

Generally, the principle of the measurement using a piezoelectric actuation structure is as follows:

The resistance variation of a metal line is proportional to its elongation:

$$\frac{\Delta R}{R} = K \frac{\Delta L}{L},$$

in which K is the gauge factor, L the length of the gauge and R its resistance.

In the case of the present invention, the gauge surrounds the overhang, commonly called "cantilever". The resistance variation is therefore twice as great since it occurs on both branches of the gauge.

By Poisson's effect, if L increases, the width of the beam decreases. The line portion situated at the edge of the cantilever contracts. The variation of the resistance as a function of the elongation of the cantilever therefore becomes:

$$\frac{\Delta R}{R} = K \cdot (2 - v_{CE}) \cdot \frac{\Delta L}{L},$$

in which $V_{CE}$ is the Poisson's ratio of the elastic layer.

The elongation of the cantilever may be expressed as follows:

$$\frac{\Delta L}{L} = \frac{e}{R_c},$$

in which e is the distance between the gauge and the neutral fibre and $R_c$ the radius of curvature of the cantilever. If the radius of curvature is assumed to be uniform over the entire length of the beam:

$$R_c = \frac{L^2}{2 \cdot Z},$$

in which Z is the beam end deflection.

The relationship between the deflection and the resistance variation is therefore:

$$Z = \frac{\Delta R}{R} \cdot \frac{L^2}{2 \cdot K \cdot (2 - v_{CE}) \cdot e}$$

In the case of a simple Wheatstone bridge assembly, the output voltage is:

$$V_{out} = \frac{V_{in}}{4} \cdot \frac{\Delta R}{R},$$

in which $V_{in}$ is the bias voltage of the bridge and $V_{out}$ is the output voltage.

Example of Production

According to the structure of the invention, a piezoresistive strain gauge is integrated on a fixed-free beam.

This structure comprises the following stack of layers on the surface of a silicon substrate:
- a silicon substrate;
- an elastic layer of SiN, 1 micron thick;
- a key coat made of $TiO_2$, 2 nanometers thick;
- a bottom electrode of Pt, 50 nanometers thick;
- a layer of PZT, 120 nanometers thick;
- a top electrode layer of Pt, 25 nanometers thick.

Figure 8:
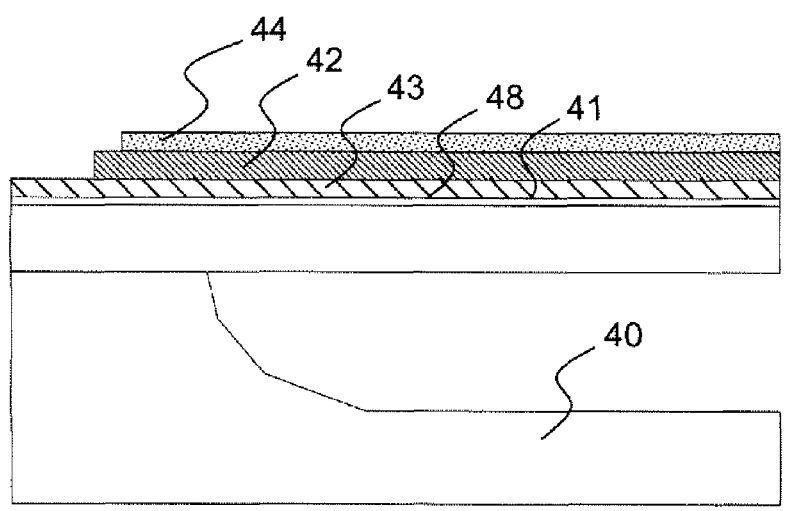
FIG. 8 illustrates a cross-sectional view of a detailed exemplary stack of layers used in a piezoelectric actuation structure according to the invention.

As illustrated in FIG. 8, the structure is produced on a silicon substrate 40 and uses an elastic layer 41. The elastic layer is made of SiN which is preferred over $SiO_2$ and makes it possible to compensate the residual strains in the freed structure.

The piezoelectric material 42 is PZT. SiN regions are released so as to be able to produce an undercut of the silicon substrate and thus obtain the beam structure as represented.

The film of PZT is deposited by sol-gel technique on the standard stack forming the bottom electrode 43 on a key coat 48. The sol-gel films are produced from a commercial solution, containing 10% excess lead precursor to avoid the lead gaps during recristallisation annealing operations. Each deposition of a layer of PZT by spin-coating gives, at the end of the process, a PZT thickness of between 50 and 60 nm. The final thickness of PZT is obtained by adjusting the number of depositions by spin-coating. The standard method for PZT deposition is:
- deposition by spin-coating
- calcination at 400° C. in air for 5 minutes
- rapid recristallisation annealing of the PZT at 700° C. for 1 minute in oxygen.

The recristallisation annealing makes it possible to obtain the perovskite phase of the PZT. The PZT films deposited form a few nm to a few μm, and for example 1 μm. The top electrode 44 is thus made of platinum deposited by sputtering.

In this way, the profile of the beam is very flat. All the layers of the piezoelectric stack Pt/PZT/Pt have a tensile strain after annealing of the PZT. The residual strain of the Pt is 1.1 GPa and that of the PZT 200 MPa. The only way to compensate these residual strains is to use a layer whose strain will be tensile, corresponding to a material subjected to a tensile strain.

Since the final etch releasing method is applied with XeF2 gas (to etch the silicon), the silicon cannot be used as an elastic layer. SiO2 always has a compressive strain. SiN is then a better choice for compensating the strains because it can have a tensile strain. Si-rich SiN has a strain of 400 MPa.

In order to confirm the benefit in terms of performance of the gauge used in a piezoelectric actuation structure of the invention, the applicant has performed deflection measurements using the piezoresistive gauge described previously and compared these measurements with those obtained by a conventional optical deflection measurement method carried out using a white light interferometer.

Figure 9:
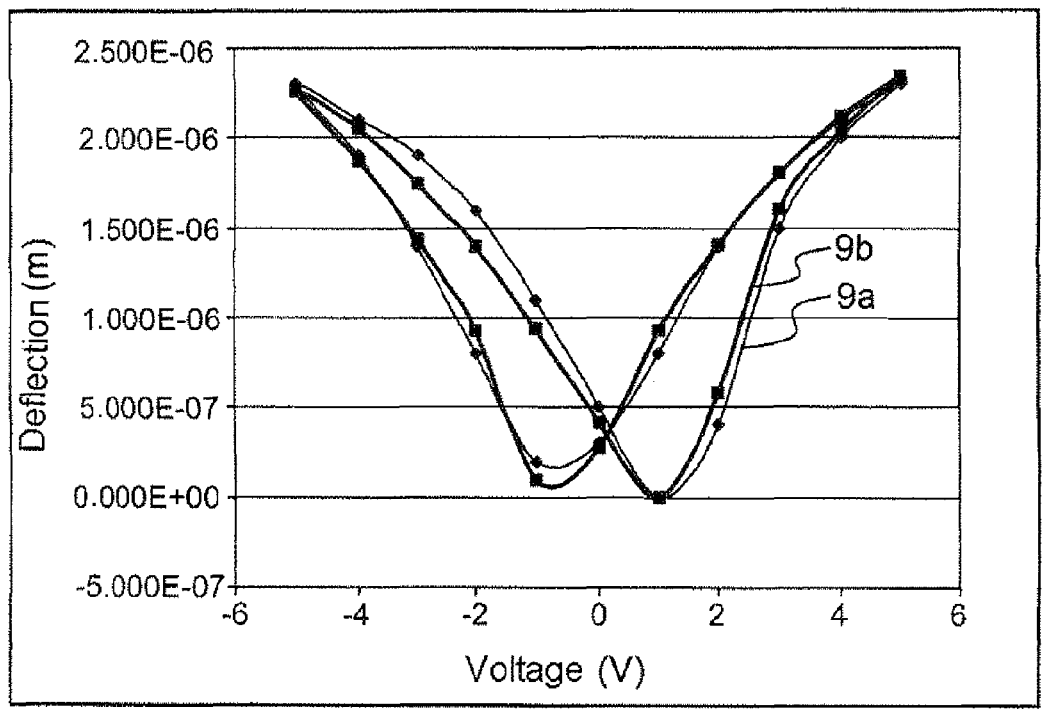
FIG. 9 illustrates the comparison of the measurements obtained in terms of deflection of a structure including a piezoresistive gauge between a direct measurement of the resistance and an optical measurement of the deflection.
Figure 10:
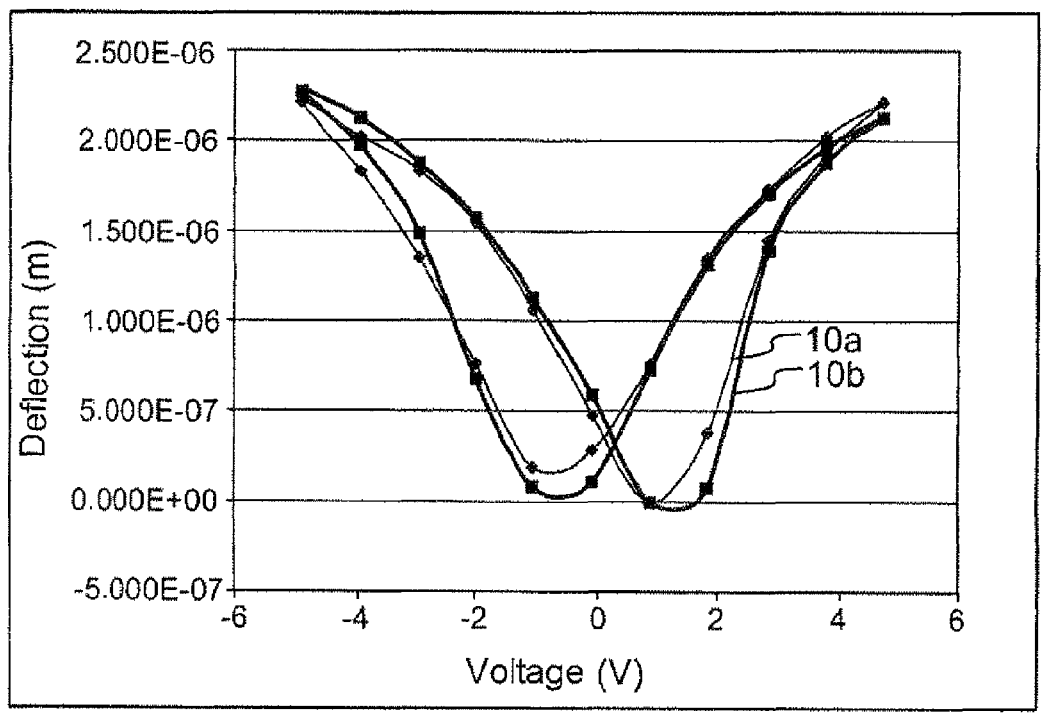
FIG. 10 illustrates the comparison of the measurements obtained in terms of deflection of a structure including a piezoresistive gauge between a measurement of the resistance with a Wheatstone bridge and an optical measurement of the deflection.

The measurements were made by direct measurement of resistance variation and by a Wheatstone bridge using a bridge voltage of 1 v to limit the gauge current, and are illustrated in FIGS. 9 and 10, the curves 9a and 10a relating to the optical measurements, the curves 9b and 10b relating to the measurements by piezoresistive gauge, giving deflection values as a function of a bias voltage.

The deflection measurements are deduced from the equations explained on the basis of the resistance variation measurements. These curves show that it is possible to achieve the same degree of accuracy as conventional optical measurements and do so by using an all-integrated structure of very straightforward technology.

What is claimed is:

1. A piezoelectric actuation structure comprising at least one strain gauge and at least one actuator produced from a stack on the surface of a substrate of at least one layer of piezoelectric material arranged between a bottom electrode layer and a top electrode layer, at least a portion of the stack forming the actuator being arranged above a cavity produced in the substrate, wherein the strain gauge is a piezoresistive gauge located in at least one of the top electrode layer and the bottom electrode layer, said layer or layers including electrode discontinuities making it possible to produce said piezoresistive gauge.

2. The actuation structure according to claim 1, wherein the piezoresistive gauge is produced in at least a portion of the top electrode layer and/or the bottom electrode layer located above the cavity.

3. The actuation structure according to claim 2, wherein said piezoresistive gauge is produced on at least a portion of the surround of the top and/or bottom electrode.

4. The actuation structure according to claim 1, further comprising an elastic substrate layer above said cavity, on which the bottom electrode is located.

5. The actuation structure according to claim 1, further comprising a fixed-free structure including a free overhang on three sides.

6. The actuation structure according to claim 1, further comprising a fixed structure over all or part of its periphery.

7. The actuation structure according to claim 6, further comprising at least one piezoelectric gauge, the piezoresistive gauge and the piezoelectric gauge including a common layer chosen from the top electrode layer and the bottom electrode layer.

8. The actuation structure according to claim 1, wherein the piezoresistive strain gauge includes at least two contact blocks connected to the piezoresistive gauge located in at least one of the electrode layers and at least two contact blocks of the piezoelectric actuator located in at least one of the electrode layers.

9. The actuation structure according to claim 1, wherein the piezoresistive gauge is produced in the bottom and top electrode layers.

10. The actuation structure according to claim 1, further comprising a set of resistive lines making it possible to integrate the piezoresistive gauge in a Wheatstone bridge structure.

11. The actuation structure according to claim 1, wherein the piezoelectric material is of lead zirconate and titanium or PZT type, or of aluminium nitride type or of zinc oxide type.

12. The actuation structure according to claim 1, wherein the bottom and/or top electrode layers are made of a platinum or tungsten or aluminium or ruthenium or ruthenium oxide or iridium, iridium oxide, copper, silver, nickel, chrome or metal alloy type material.

13. The actuation structure according to claim 4, wherein the elastic substrate layer is made of a silicon type or silicon oxide type, or silicon nitride type or conductive polymer type material.

14. A method for producing a piezoelectric actuation structure according to claim 1, said method comprising:
depositing a bottom electrode layer on a substrate;
depositing a layer of piezoelectric material on the substrate;
etching the layer of piezoelectric material to define a mesa of piezoelectric material of smaller dimensions;
depositing a top electrode layer on the layer of piezoelectric material and on the bottom electrode layer; and
etching of both the top electrode layer and the bottom electrode layer to define a piezoresistive gauge in the stack of the top and bottom electrode layers.

15. The method according to claim 14, further comprising depositing an elastic layer on the substrate on which the bottom electrode layer is deposited.

16. The method according to claim 15, further comprising:
etching at least one of the elastic layer, the bottom electrode layer, and the piezoelectric material layer stack to define a mesa; and
depositing the top electrode layer on the mesa and the substrate.

17. The method according to claim 14, further comprising etching the top electrode to define a piezoresistive gauge from the top electrode layer.

* * * * *